United States Patent [19]

Bustin

[11] 4,229,703
[45] Oct. 21, 1980

[54] ZERO REFERENCE AND OFFSET COMPENSATION CIRCUIT

[75] Inventor: Raphael Bustin, Rockport, Mass.

[73] Assignee: Varian Associates, Inc., Palo Alto, Calif.

[21] Appl. No.: 11,358

[22] Filed: Feb. 12, 1979

[51] Int. Cl.³ .............................................. H03K 5/00
[52] U.S. Cl. .................................... 328/162; 330/9; 340/347 M; 340/347 CC
[58] Field of Search .... 340/347 M, 347 CC, 347 AD; 328/162–165; 330/9

[56] References Cited

U.S. PATENT DOCUMENTS

| 3,316,751 | 5/1967 | Burk | 340/347 CC X |
| 3,530,458 | 9/1970 | Willard et al. | 340/347 CC |
| 3,685,048 | 8/1972 | Pincus | 340/347 CC X |
| 3,811,125 | 5/1974 | Schumann | 340/347 CC X |
| 3,824,481 | 7/1974 | Sponholz et al. | 340/347 CC X |
| 4,122,719 | 10/1978 | Carlson et al. | 73/342 X |

OTHER PUBLICATIONS

The Engineering Staff of Analog Devices, Inc., Analog-Digital Conversion Handbook, 6/1972, pp. I-105,106; III-1 to III-11.
Schmid, Electronic Analog/Digital Conversions, Van Nostrand Reinhold Co., 1970, pp. 387–391.

Primary Examiner—Thomas J. Sloyan
Attorney, Agent, or Firm—Stanley Z. Cole; Norman E. Reitz

[57] ABSTRACT

A zero reference and offset compensation circuit for an operational amplifier operating in the inverting mode in order to correct for both current and voltage offset errors. The zero reference and offset compensation circuit includes comparators for comparing the zero condition output of the operational amplifier with representations of lower and upper boundary signal levels, a pair of digital-to-analog converters having their respective analog outputs connected through appropriate scaling networks to the inverting input terminal and to the non-inverting input terminal of the operational amplifier, a microprocessor connected to the output of the comparators for providing an input to the associated digital-to-analog convertor so it produces an incremented digital signal whenever the comparators indicate the zero condition signal output exceeds either boundary signal level, the incremented digital signal being incremented in a direction to drive the associated digital-to-analog converter in a direction to bring said zero condition signal within the boundary which has been exceeded. The microprocessor has a current range selection capability so that the digital-to-analog converter connected to the inverting terminal is incremented for nanoampere range signal currents and the digital-to-analog converter associated with the non-inverting terminal is incremented for signal currents in the microampere range and above.

6 Claims, 2 Drawing Figures

ZERO REFERENCE AND OFFSET COMPENSATION CIRCUIT

This invention relates to a zero reference and offset compensation circuit for analog signal processing circuitry and, more particularly, relates to a zero compensation circuit for analog signal processing which does not interrupt the processing of signals and which can correct for both current and voltage offset errors.

Various techniques for maintaining an accurate zero reference and offset free level in analog devices are known. The so-called chopper-stabilization technique uses the charge stored in a capacitor as the reference against which operating levels are compared. Due to capacitor leakage or "droop", the zeroing and offset correction cycle must be accomplished with high frequency. Also, chopper-stabilization schemes for zero reference and offset compensation require demodulation and filtering thereby lowering bandwidth. As a result, such schemes are not suitable for providing real time representation of input signals containing large bandwidths.

The use of temperature-dependent devices to generate correction signals is not a fully effective compensation scheme because it requires careful characterization of each error source. Not all error sources are dealt with, i.e., power supply drifts and device aging effects are not appropriately handled, and many error sources are exceedingly difficult to characterize.

There are analog signal processing applications in which it is not desired to interrupt the signal. For example, the dose processor Model MP-100 produced by Varian/Extrion measures the ion beam current in a real time mode for ion implantation schemes. When the appropriate dosage level is reached, the ion beam current is cut off. Since the dosage is required to be precise, e.g., for the implantation of impurities in semi-conductor devices, it is essential that the dosage measurements be precise. Thus, no interruption of the processing of the signal representing instantaneous dose rate is desirable. Similarly, in the Uniformity Monitor Model-MP-200 produced by Varian/Extrion it is desirable to measure total doping level in a particular segment of the substrate in order to measure uniformity. In this application no interruption of the analog signal processing can be tolerated. In addition, it is desirable to have effective zero reference and offset error compensation at all levels of operation. For example, in electrometer applications or at low current levels the primary source of zero reference and offset error will be current drift, whereas at higher current levels the primary source of zero reference and offset error will be voltage drift. Thus, for an integrator which must operate over many ranges the particular zero reference and offset compensation routine should be selected to match the source of the error.

It is therefore an object of the present invention to provide a zero reference and offset compensation circuit for analog signal processing which does not require frequent interruption of the analog signal.

It is a further object of the present invention to provide a zero reference and offset compensation circuit which matches the compensation routine to the primary source of zero reference and offset error.

It is another object of the present invention to provide a zero reference and offset compensation circuit which maintains a steady reference level during the operation of an analog signal processing circuit.

SUMMARY OF THE INVENTION

A zero reference and offset compensation circuit is provided for an operational amplifier operating in the inverting mode, in order to correct for both current and voltage offset errors. The zero reference and offset compensation circuit includes a comparison means for comparing the zero condition signal output of the operational amplifier with representations of lower and upper boundary signal levels, a pair of digital-to-analog converters having their respective analog outputs connected through appropriate scaling networks to the inverting input terminal and to the non-inverting input terminal of the operational amplifier to correct, respectively, for current drift and voltage drift, means connected to the output of the comparison means for generating an incremented digital signal whenever the comparison means indicates the zero condition signal output exceeds either boundary signal level, the incremented digital signal being incremented in a direction to drive the associated D/A converter in a direction to bring the zero condition signal within the boundary which has been exceeded, and means for selectively connecting the output of said means for generating an incremental digital signal with one or the other of said pair of digital-to-analog converters.

BRIEF DESCRIPTION OF THE DRAWINGS

For a more complete understanding of the zero reference and offset compensation circuit of the present invention, reference may be had to the accompanying drawings which are hereby incorporated by reference and in which.

DESCRIPTION OF THE PREFERRED EMBODIMENTS

The zero reference and offset compensation circuit of the present invention is suitable for use in analog signal processing circuits. Such an analog signal processing circuit will contain operational amplifiers which are functioning in the inverting mode. The function and applications of operational amplifiers are well known. See, e.g., G. E. Tobey, et al., *Operational Amplifiers: Design and Applications*, McGraw-Hill (1971). It is the purpose of the zero reference and offset compensation circuit of the present invention to provide a zero reference and offset compensation for such operational amplifiers which are operating in the inverting mode in analog signal processing circuits. The zero reference and offset compensation circuit is intended to be employed during periods when no analog signal is being processed, i.e., in between runs of the instrument incorporating the analog signal processing circuit.

Figure 1:
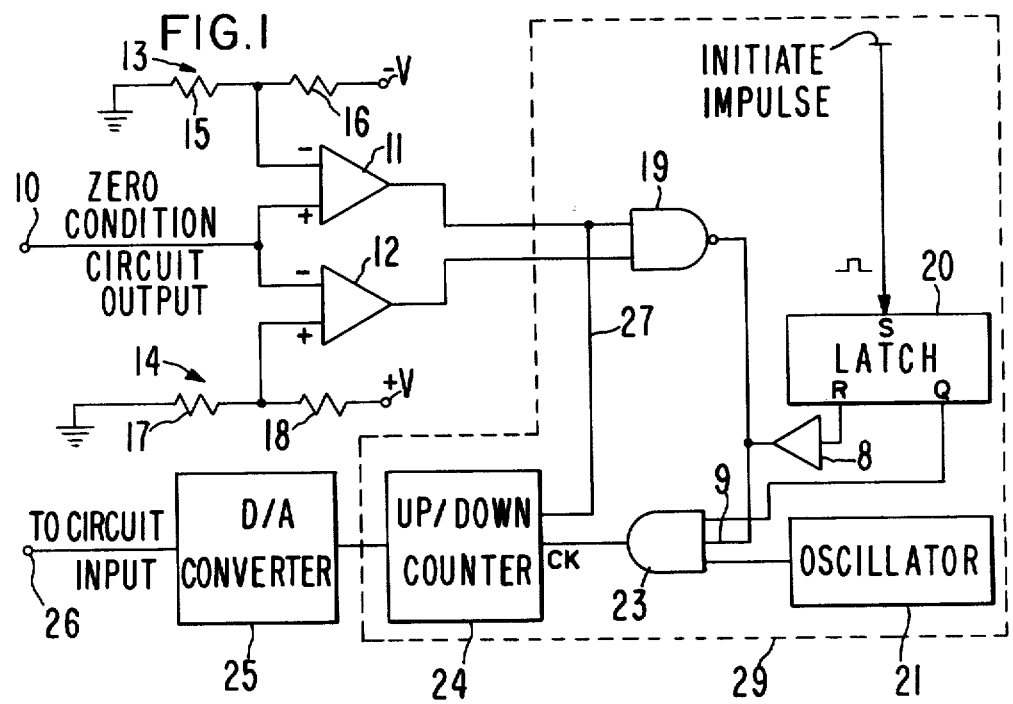
FIG. 1 is a schematic diagram illustrating the functional elements of a loop used in the zero reference and offset compensation circuit of the present invention.

The functional implementation of a single loop of the zero reference and offset compensation circuit of the present invention may be seen by reference to FIG. 1. A zero condition output is taken from the analog circuit and introduced at terminal 10. This signal level is provided as the input to the two comparators 11 and 12.

The other input of each comparator is connected, respectively, to resistor networks 13 and 14. The values of resistors 15 and 16 in resistor network 13, as well as the values of resistors 17 and 18 in resistor network 14 are selected to provide voltages which represent, respectively, the lower and upper bounds for permissible zero condition output values for the analog processing circuit. The output of comparator 11, for example, will be low if the zero condition output is less than the lower boundary; similarly, the output of comparator 12 will be low if the zero condition output is higher than the upper boundary. These two outputs provide the inputs to a NAND gate 19 and are also connected to the inputs of up/down counter 24. If either comparator has a low output, i.e., if the zero condition signal is outside the window established by resistor networks 13 and 14, NAND gate 19 will provide a high output to input 9 of AND gate 23. When the S-R latch 20 is activated by a momentary high level signal at its S input, its Q output goes to a high level and a pulse train from oscillator 21 is gated through AND gate 23 to a digital up/down counter 24 such as a 74191 4-bit counter or multiples thereof. If a pulse train is gated, the direction of counting, i.e., either up or down, will be determined by the logic state of line 27. The output of up/down counter 24 drives a D/A converter 25 such as Signetics NE 5018 8-bit converter by providing it an incremented digital input. As the incremented digital input is greater or lesser than the input previously provided, a higher or lower voltage level will be produced at terminal 26. Terminal 26 is connected with appropriate scaling to the input of the analog signal processing circuit. This incremental direction occurs continuously until the zero condition circuit output appearing at terminal 10 falls within the bounds set by resistor networks 13 and 14. When this condition occurs, the outputs of comparators 11 and 12 are both high, the output of NAND gate 19 is low, the output of inverter 8 is high and latch 20 is reset. The output of D/A convertor 25 is held steady on terminal 26 until the next zero reference and offset compensation routine is run. Considerable periods can elapse between the performance of the zero reference and offset compensation routine and the operation of the analog signal processing circuit need not be interrupted. The setting to provide accurate zero reference and offset compensation is maintained in digital form in a manner previously accomplished only by digital computers and complex peripheral circuitry as in U.S. Pat. No. 3,530,458, "Analog to Digital Conversion System Having Improved Accuracy."

Figure 2:
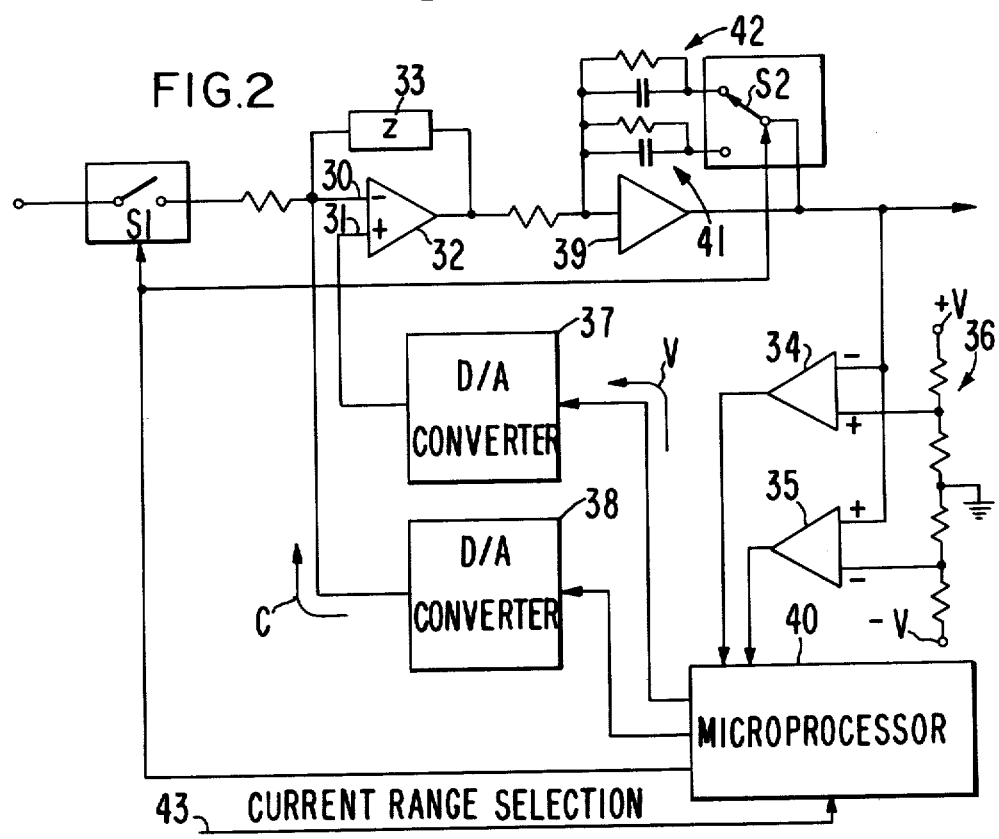
FIG. 2 is a schematic diagram illustrating the zero reference and offset compensation circuit of the present invention which incorporates portions of a microprocessor and which is illustrated in conjunction with the analog signal processing circuit for which zero reference and offset compensation is attained.

In the zero reference and offset compensation circuit of the present invention, shown in FIG. 2, a pair of loops of the functional type described above with respect to FIG. 1 are utilized in conjunction with switching means to establish the zero condition for the analog signal processor, and switching means to introduce a high gain override on the analog signal processing circuit. As set out in the Background of the Invention, a zero reference and offset compensation circuit is required to operate over a wide range of operating conditions from low current levels to high current levels. At low current levels or in sensitive electrometer circuits, the primary source of zero reference and offset error will be current leakage. In the nanoampere range and up to the microampere range materials which are normally considered to be good insulators leak enough current to serve as a source or analog signal error. This is compensated for by the loop C shown in FIG. 2, which provides an offset adjustment to the inverting terminal 30 of operational amplifier 32. At higher current levels above the microampere range voltage errors predominate and in these ranges one can assume that there is no significant current offset. This is compensated for by the loop V which provides an offset adjustment to the non-inverting terminal 31 of operational amplifier 32. The designation of the range of operation is accomplished by the operator on current range selection line 43. Microprocessor 40 then activates either loop V or loop C in accordance with the rules of operation described above. In actual operation, it may be desirable for low current levels to initially activate loop V in order to compensate for voltage effects and then to activate current loop C to compensate for current effects. With high signal levels only voltage compensation need be considered.

An embodiment of the present invention is illustrated in FIG. 2. This embodiment utilizes a microprocessor 40 such as the INTEL 8080 to perform the function enclosed within dotted lines 29 in FIG. 1 (see previous description of operation of FIG. 1). In operation, switch S1 is opened to establish a zero condition for operational amplifier 32. Simultaneously, switch S2 switches from the normal gain setting determined by RC feedback stage 41 associated with inverter 39 to a high gain setting determined by RC feedback stage 42; this serves to enhance any zero reference or offset errors in order to facilitate subsequent comparison in comparators 34 and 35. If the signal level at the output of inverter 39 is within the upper and lower boundaries set by resistor network 36, then the outputs of comparators 34 and 35 remain high and microprocessor 40 resets switches S1 and S2 and no feedback correction is performed. If the zero condition signal level exceeds these boundaries, then the microprocessor 40 generates an incremented digital number appropriately higher or lower than the number held in memory to the particular D/A converter in the activated loop. If the voltage loop V is activated by microprocessor 40, then an incremented digital number is provided to D/A converter 37 such as a Signetics 8-bit NE 5018 which provides an appropriately altered analog output through an appropriate scaling network to non-inverting input 31 of operational amplifier 32. Alternatively, if current loop C is activated by microprocessor 40, then an incremented digital number is provided to D/A converter 38 which provides an appropriately altered output through an appropriate scaling network to the inverting input 30 of operational amplifier 32. Once the zero reference and offset compensation routine is run the digital numbers associated, respectively, with D/A converters 37 (loop V) and 38 (loop C) are held in memory in microprocessor 40 and the analog outputs of the two D/A converters are held steady during the subsequent signal processing through the analog circuit.

I claim:

1. A zero reference and offset compensation circuit adapted to compensate for zero reference and offset errors in an operational amplifier operating in the inverting mode, comprising:

comparison means for comparing the zero condition signal output of said operational amplifier with representations of lower and upper boundary signal levels;

a pair of digital-to-analog converters having their respective analog outputs connected through appropriate scaling networks to the inverting input terminal and to the non-inverting input terminal of said operational amplifier to correct, respectively, for current drift and voltage drift;

means connected to the output of said comparison means for generating an incremented digital signal whenever said comparison means indicates said zero condition signal output exceeds either boundary signal level, said incremented digital signal being incremented either up or down to drive an associated D/A converter either up or down to bring said zero condition signal within the boundary which has been exceeded;

and means for selectively connecting the output of said means for generating an incremented digital signal with one or the other of said pair of digital-to-analog converters.

2. A zero reference and offset compensation circuit as set out in claim 1 in combination with a set-reset latch to activate said means for generating an incremented digital signal when said operational amplifier is not processing an analog signal and to deactivate said means for generating an incremented digital signal when said comparison means indicates said zero condition signal output does not exceed said representation of lower and upper boundary signal levels.

3. A zero reference and compensation circuit as set out in claim 2 wherein said means for generating an incremented digital signal comprises an oscillator, an AND gate whose inputs are connected, respectively, to the output of said comparison means and to the output of said oscillator and to the Q line from said set-reset latch, and an up/down binary counter whose inputs are connected, respectively, to the output of said AND gate and to a logic state line from said comparison means.

4. A zero reference and compensation circuit as set out in claim 1 wherein said means for generating an incremented digital signal comprises a microprocessor.

5. A zero reference and compensation circuit in accordance with claim 4 wherein said means for selectively connecting the output of said means for generating an incremented digital signal with one or the other of said pair of digital-to-analog converters is incorporated within said microprocessor and is activated by a current range select line input to said microprocessor.

6. A zero reference and compensation circuit in accordance with claim 5 in combination with switching means across the inverting terminal of said operational amplifier, and a high gain stage switchably coupled across the output of said operational amplifier.

* * * * *